(12) United States Patent
Suzuki

(10) Patent No.: US 6,934,189 B2
(45) Date of Patent: Aug. 23, 2005

(54) NONVOLATILE SEMICONDUCTOR MEMORY DEVICE AND METHOD OF WRITING DATA THEREIN

(75) Inventor: Koji Suzuki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/253,925

(22) Filed: Sep. 25, 2002

(65) Prior Publication Data

US 2003/0086298 A1 May 8, 2003

(30) Foreign Application Priority Data

Nov. 8, 2001 (JP) ........................................ 2001-342804

(51) Int. Cl.[7] .............................................. G11C 16/04
(52) U.S. Cl. ............................ 365/185.19; 365/185.18; 365/185.25
(58) Field of Search ....................... 365/185.19, 185.18, 365/185.25

(56) References Cited

U.S. PATENT DOCUMENTS

| | | | |
|---|---|---|---|
| 4,380,804 A | * | 4/1983 | Lockwood et al. ......... 365/184 |
| 5,493,141 A | | 2/1996 | Ricco et al. |
| 5,946,236 A | | 8/1999 | Kajitani et al. |
| 5,973,956 A | | 10/1999 | Blyth et al. |
| 6,067,253 A | * | 5/2000 | Gotou ................... 365/185.25 |
| 6,069,822 A | * | 5/2000 | Canegallo et al. ..... 365/185.19 |

FOREIGN PATENT DOCUMENTS

| | | |
|---|---|---|
| JP | 07-037395 | 2/1995 |
| JP | 7-122081 | 5/1995 |
| JP | 10-228784 | 8/1998 |
| JP | 10-275480 | 10/1998 |
| JP | 10-283787 | 10/1998 |
| JP | 10-510658 | 10/1998 |

* cited by examiner

*Primary Examiner*—Huan Hoang
(74) *Attorney, Agent, or Firm*—Volentine Francos & Whitt, PLLC

(57) ABSTRACT

A nonvolatile semiconductor memory device has a memory cell with a floating gate. The memory cell is coupled to a switching circuit such as an inverter. A series of pulses supplied to the inverter generates current spikes by alternately charging and discharging a parasitic capacitance associated with the memory cell. The current spikes are supplied from the switching circuit to the memory cell, where they inject electrons into the floating gate, thereby writing data in the memory cell without the need for a high current flow or for complex control circuitry.

20 Claims, 10 Drawing Sheets

NONVOLATILE SEMICONDUCTOR MEMORY DEVICE AND METHOD OF WRITING DATA THEREIN

BACKGROUND OF THE INVENTION

1. Field of the Invention

The present invention relates to a semiconductor memory device having electrically programmable nonvolatile memory cells with floating gates, and more particularly to a method of injecting electrons into the floating gates.

2. Description of the Related Art

Among the known types of electrically programmable nonvolatile semiconductor memory devices are electrically programmable read-only memory (EPROM), electrically erasable programmable read-only memory (EEPROM), and flash memory. Each of the many memory cells in a nonvolatile semiconductor memory device of one of these types has a high-resistance floating gate for storing information. Each memory cell is in one of two states, depending on whether electrons have been injected into the floating gate, and thus stores a one-bit digital value, which can be sensed as a high or low signal value. Injecting electrons into the floating gate is equivalent to writing data in the memory cell, and is also referred to as programming the memory cell.

Two general methods of injecting electrons into the floating gate of a memory cell are known.

(1) The channel hot electron (CHE) injection method generates high-energy electrons, also referred to as hot electrons, by passing a high current between the source and drain of the memory cell, and injects the hot electrons into the high-resistance floating gate.

(2) The Fowler-Nordheim (FN) tunneling method applies a high voltage between the gate and drain of the memory cell, creating a strong electric field that enables current to tunnel into the floating gate.

FIG. 11 illustrates the programming of a memory cell by the conventional CHE injection method.

To program the memory cell M81 in FIG. 11, a potential Vg of twelve volts (12 V) is supplied from a power supply to the control gate electrode (G), a potential Vd of six to seven volts (6 V to 7 V) is supplied to the drain electrode (D), and the source electrode (S) is grounded. A high current $I_{DS}$ flows from the drain electrode to the source electrode, generating hot electrons, some of which are injected into the floating gate (FG) 82. The current flow is switched on and off by a control circuit (not shown). Basically, the current is switched on, allowed to flow for a time sufficient to inject the necessary quantity of charge into the floating gate 82, then switched off. Thus conventional CHE injection takes place in a single current pulse, during which current flows at a steady high rate from drain to source.

FIG. 12 illustrates the programming of a memory cell by the FN tunneling method.

To program the memory cell M91 in FIG. 12, a potential Vg of ten volts (10 V) is supplied from a power supply to the control gate electrode (G), a potential Vd of minus eight volts (−8 V) is supplied to the drain electrode (D), and the source electrode (S) is left floating. The high voltage (18 V) between the control gate and drain electrode enables current to flow by a tunneling effect, injecting electrons into the floating gate (FG) 92. The high voltage is applied between the control gate and drain as a single voltage pulse, under control of a control circuit (not shown). Tunneling current flows at a low rate, so the pulse duration is correspondingly long.

Thus, when data are written in a memory cell in a conventional nonvolatile semiconductor memory device by injecting electrons into the high-resistance floating gate, either CHE injection is performed with one high current pulse, or FN tunneling current is generated by one high voltage pulse.

The conventional method of CHE injection described above requires considerable current. If the memory device has an array of memory cells with floating gates arranged in a row-column matrix, and if the control circuit injects electrons into a plurality of memory cells simultaneously, the power supply circuit must have a correspondingly high current capacity. A resulting problem is that if an external power supply circuit is used to program many devices at once, a large power supply is needed. A similar problem occurs if the power supply circuit is a voltage-boosting circuit integrated into the memory device; to provide the needed current capacity, the power supply circuit must be relatively large in scale, taking up much space in the layout of the memory device.

The FN tunneling method requires relatively little current, and can inject electrons simultaneously into a plurality of memory cells without the need for a large power supply circuit. FN tunneling, however, takes more time than CHE injection. A memory cell of the FN tunneling type therefore has a longer write access time than does a memory cell of the CHE injection type. Furthermore, to write data into one particular memory cell in an array of memory cells of the FN type, a high voltage must be applied for a relatively long period of time between the control gate and the drain electrode of the memory cell. Compared with CHE injection, FN tunneling therefore requires more complicated control circuitry (including memory cell selection circuitry and a voltage-boosting circuit).

SUMMARY OF THE INVENTION

An object of the present invention is to provide a semiconductor memory device that can inject electrons into a floating gate without requiring a high current flow.

Another object is to provide a semiconductor memory device that can inject electrons into a floating gate without requiring a complex control circuit.

Another object of the invention is to provide a method of writing data in a nonvolatile semiconductor memory device.

The invented method writes data into a nonvolatile semiconductor memory device having a memory cell with a floating gate. The memory cell is connected to a switching means. A pulse signal such as a write clock signal is supplied to the switching means, generating a series of current spikes by alternately charging and discharging a parasitic capacitance associated with the memory cell. Supplied from the switching means to the memory cell, the current spikes inject electrons into the floating gate.

The invention also provides a first nonvolatile semiconductor memory device having a memory cell with a floating gate and a switching means connected to the memory cell. The switching means receives a pulse signal in which rising and falling transitions occur at regular intervals, and supplies current to the memory cell at the rising and/or falling transitions, thereby injecting electrons into the floating gate of the memory cell.

The switching means includes, for example, a complementary pair of switching elements, such as a p-channel transistor and an n-channel transistor. The memory cell may be connected in series between the two switching elements. Alternatively, the two switching elements may be connected in series between a power supply and ground, with one electrode of the memory cell connected to a node between the two switching elements.

The invention further provides a second nonvolatile semiconductor memory device having a row-column matrix of memory cells with respective source, drain, and gate electrodes and floating gates. Columns of memory cells are connected by source lines to ground and by bit lines to a drain power supply, the bit lines being connected to the drain electrodes of the memory cells. Rows of memory cells are connected by word lines to a gate power supply, the word lines being connected to the gate electrodes of the memory cells. A plurality of switching means are connected to respective columns of memory cells through the bit lines and/or the source lines. The switching means, which are also connected in parallel to the drain power supply, receive a pulse signal such as a write clock signal, and supply current to the memory cells at transitions in the pulse signal, thereby injecting electrons into the floating gates.

The pulse signal may be gated by selection signals, and the gate power supply by data signals. Alternatively, the pulse signal may be gated by data signals and the gate power supply by selection signals.

Each switching means in the second nonvolatile semiconductor memory device includes, for example, a complementary pair of switching elements, such as a p-channel transistor and an n-channel transistor. One of these switching elements may switchably couple one of the bit lines to the drain power supply, while the other switching element switchably grounds one of the source lines. Alternatively, one of the switching elements may switchably couple the drain power supply to one of the bit lines, while the other switching element switchably couples the same bit line to ground. In the latter case, the two switching elements may form an inverter, and the switching means may also include a logic gate that gates the pulse signal according to a data signal, and supplies the gated pulse signal to the inverter.

DETAILED DESCRIPTION OF THE INVENTION

Figure 1:
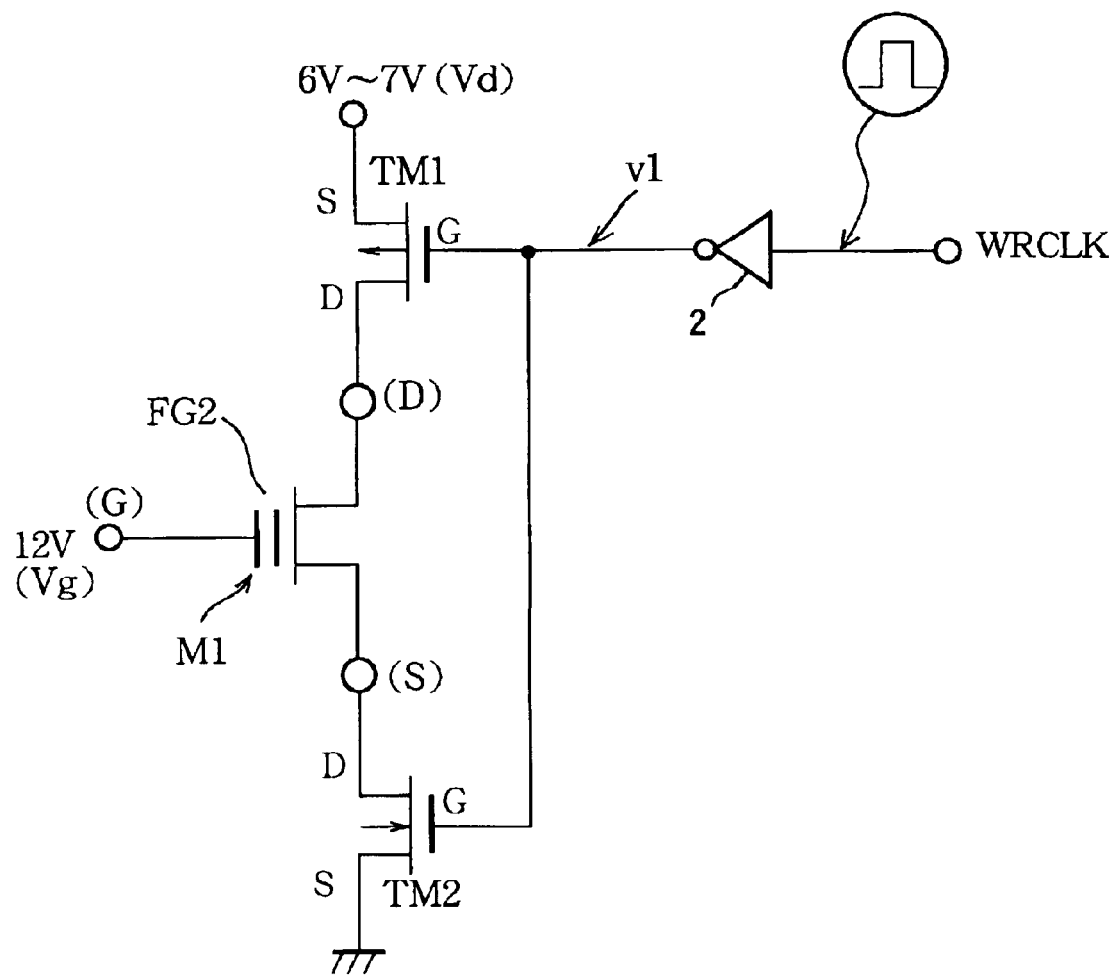
FIG. 1 is a circuit diagram illustrating part of a nonvolatile semiconductor memory device according to a first embodiment of the invention.

Embodiments of the invention will now be described with reference to the attached drawings, in which like elements are indicated by like reference characters.

In the following embodiments, a switching means is connected to at least the drain electrode of the memory cell, a series of voltage pulses is supplied to the switching circuit, and electrons are injected into the floating gate of the memory cell by short current spikes generated at the rising and falling transitions of the voltage pulses.

First Embodiment

FIG. 1 is a block diagram showing the structure of a nonvolatile semiconductor memory device in a first embodiment of the invention.

The nonvolatile semiconductor memory device in FIG. 1 comprises a memory cell M1, a p-channel metal-oxide-semiconductor (P-MOS) transistor TM1, an n-channel metal-oxide-semiconductor (N-MOS) transistor TM2, and an inverter 2. The memory cell M1 is a field-effect transistor having a floating gate FG2. P-MOS transistor TM1 is connected as a switching means to the drain (D) of the memory cell M1; N-MOS transistor TM2 is connected as a switching means to the source (S) of the memory cell M1. The inverter 2 inverts a clock signal WRCLK and supplies the resulting inverted pulse signal v1 to the gates G of transistors TM1 and TM2. Current flows through the memory cell M1 at the rising and falling edges of the pulse signal v1, when the transistors TM1 and TM2 switch on and off.

P-MOS transistor TM1 has its drain electrode D connected to the drain electrode (D) of the memory cell M1, its gate electrode G connected to the output terminal of the inverter 2 to receive the pulse signal v1, and its source electrode S connected to a drain power supply Vd that provides a voltage of six to seven volts (6 V to 7 V), which transistor TM1 supplies to the drain electrode of the memory cell M1.

Memory cell M1 has its drain electrode (D) connected to the drain electrode D of transistor TM1, its control gate electrode (G) connected to a gate power supply Vg that supplies twelve volts (12 V) during write access, and its source electrode (S) connected to the drain electrode D of transistor TM2.

N-MOS transistor TM2 has its drain electrode D connected to the source electrode (S) of the memory cell M1, its gate electrode G connected to the output terminal of the inverter 2 to receive the pulse signal v1, and its source electrode S connected to ground (0 V).

Although the same pulse signal v1, generated by the inverter 2 by inverting the write clock signal WRCLK, is input to the gate electrodes G of both P-MOS transistor TM1 and N-MOS transistor TM2, these transistors turn on and off at opposite timings, because they have complementary switching characteristics. Theoretically, when one transistor is on, the other transistor is off; the two transistors never conduct current simultaneously, or conduct simultaneously for only a transient instant during switching. Therefore, current never flows steadily through transistors TM1 and TM2; there is only a momentary flow of current that may occur as a transient switching event, accompanied by short current spikes due to the charging and discharging of parasitic capacitances, as will described below.

Figure 11:
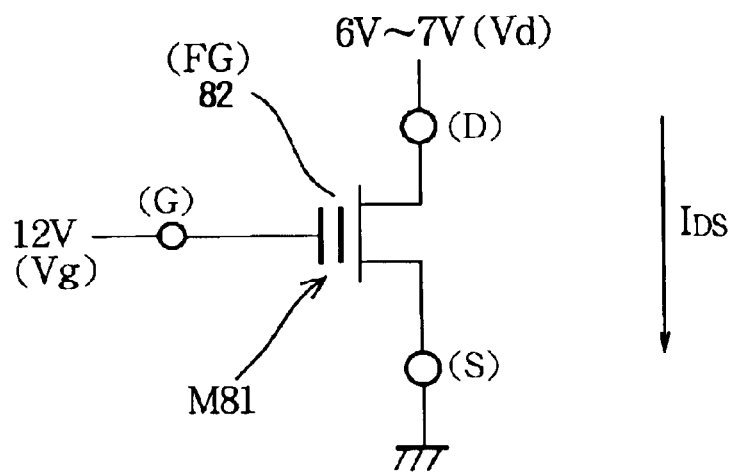
FIG. 11 is a circuit diagram illustrating the programming of a memory cell by conventional CHE injection.
Figure 12:
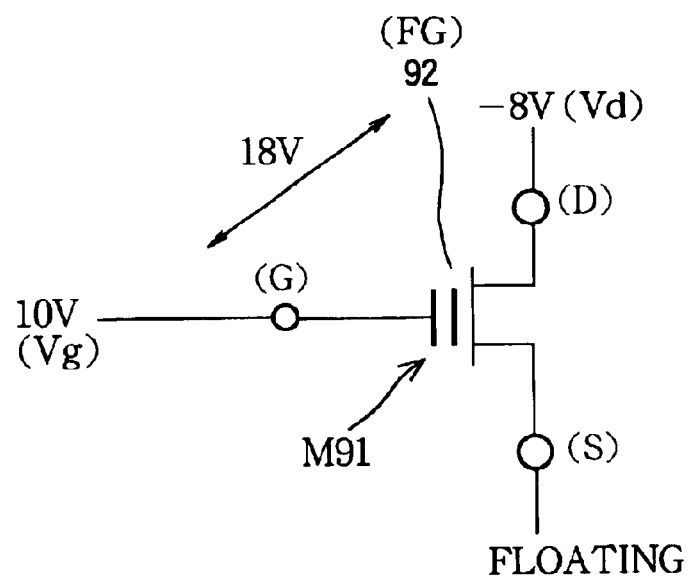
FIG. 12 is a circuit diagram illustrating the programming of a memory cell by conventional FN tunneling.

This embodiment has a very simple pulse supply structure: a write clock signal, provided for the purpose of writing data, supplies pulses at regular intervals; the inverter 2 adjusts the rise and fall times of the pulse signal. Electrons are injected in a manner generally similar to conventional CHE injection, by switching transistors TM1 and TM2 on and off to send current through the memory cell M1, but the current is allowed to flow only in a series of very short bursts or 'spikes'. Electron injection has been verified from the results of experiments conducted by the inventor, as will be described later with reference to FIGS. 4 and 5. The experimental results indicate that a memory cell similar to the conventional memory cell M81 used in FIG. 11 can be employed as the memory cell M1 of the present embodiment.

The basic principle of the invention is that electrons are injected into the floating gate FG2 by current spikes generated when the parasitic capacitance at the source and drain of the memory cell M1 is charged and discharged. The write access time can be shortened by increasing the rate at which current spikes are generated. This has also been verified in the inventor's experiments, which indicate that a higher spike rate results in better electron injection.

One advantage of this embodiment is thus that the write access speed of the memory cell can be improved simply by increasing the frequency of the clock signal used to supply the current spikes (thereby shortening the intervals between pulses). A further advantage is that a single pulse input to the switching transistors TM1, TM2 supplies two current spikes to the memory cell M1, one at the rising transition of the pulse and another at the falling transition. This advantage illustrates the general principle that a complementary pair of switching means having mutually opposite on/off characteristics can generate two current spikes from a single input pulse.

As noted above, a P-MOS transistor TM1 is connected as a switching means to the drain side of the memory cell M1 and an N-MOS transistor TM2 is connected as a switching means to the source side. This configuration makes it possible to supply similar current spikes to the memory cell when either a rising pulse edge or a falling pulse edge is input to the switching means.

When the pulse (clock) signal is supplied, the switching means change state at the rising edge and falling edge of each pulse, alternately charging the parasitic drain capacitance and discharging the parasitic source capacitance of the memory cell M1, thereby creating an electric potential difference between drain and source and causing a short spike of current to flow across the memory cell, from the drain to the source. The current spikes are substantially simultaneous with the rising and falling edges of the pulse signal. This embodiment thus consumes current only at the beginning and of each programming pulse, and not throughout the duration of the pulse as in conventional CHE injection.

Due to the parasitic capacitance, the drain voltage waveform and source voltage waveform of the memory cell do not have sharp rising and falling edges. The complementary pair of switching means (P-MOS transistor TM1 and N-MOS transistor TM2) with mutually opposite on/off characteristics are connected to the memory cell not only to prevent a steady current flow, but also to supply current spikes with similar levels at both the rising edges and falling edges of the pulse signal. In this embodiment, the P-MOS transistor TM1 serves this purpose on the drain (D) side of the memory cell M1, and the N-MOS transistor TM2 serves this purpose on the source (S) side of the memory cell M1.

Figure 2:
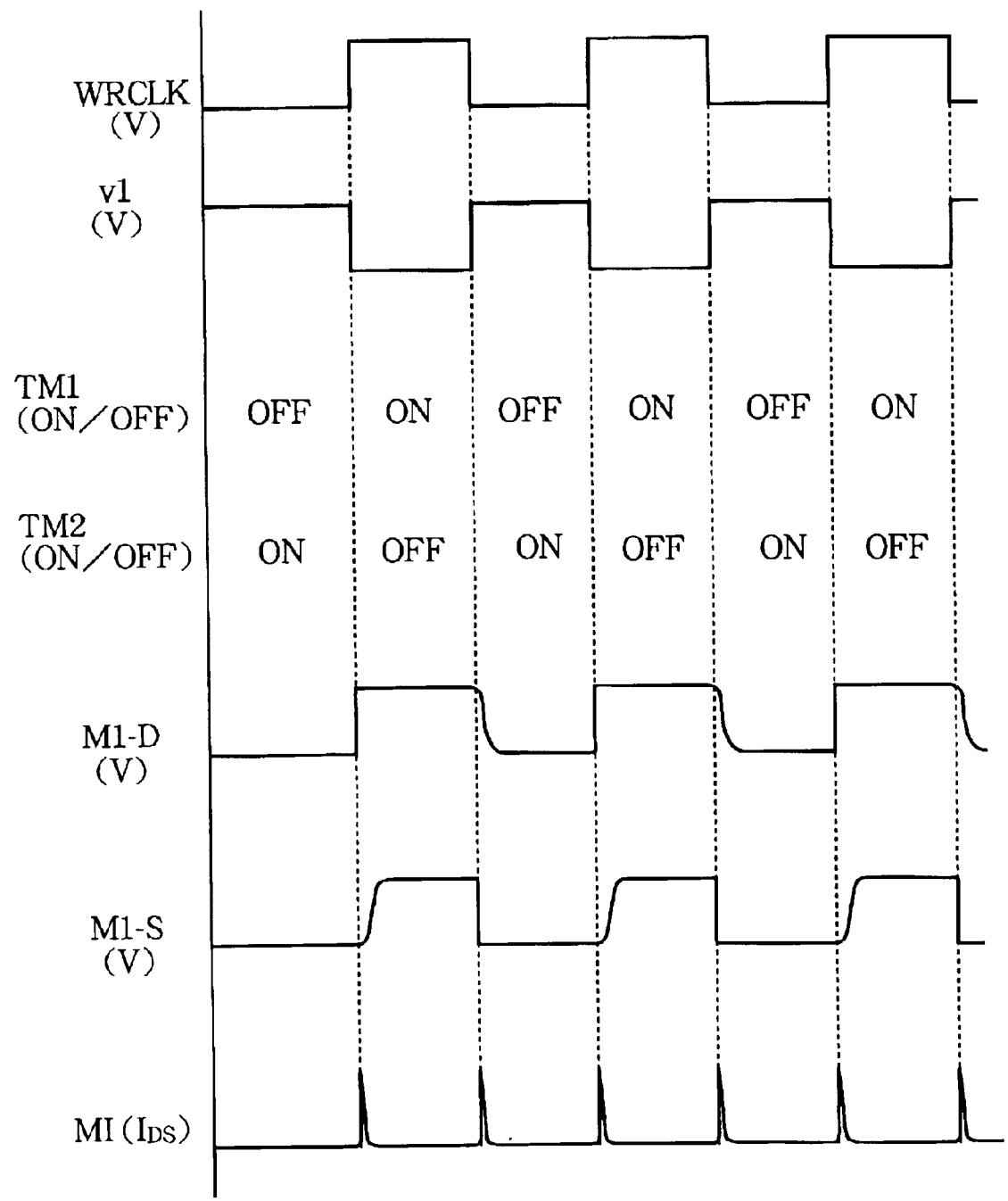
FIG. 2 is a timing diagram showing signal waveforms in the circuit in FIG. 1.

Next, the operation of the nonvolatile semiconductor memory device in this embodiment will be described. FIG. 2 is a timing diagram that shows signal waveforms and switching states at various points in the nonvolatile semiconductor memory device in FIG. 1. Shown in order from top to bottom are the waveform of the clock signal WRCLK that supplies pulses at regular intervals for writing data into the memory cell, the waveform of the inverted pulse signal v1 obtained from WRCLK by the inverter 2, the on/off state assumed by P-MOS transistor TM1 in response to the pulse signal v1, the on/off state assumed by N-MOS transistor TM2 in response to the pulse signal v1, the drain voltage waveform M1-D and the source voltage waveform M1-S of the memory cell M1, and the waveform of the current spikes $I_{DS}$ flowing between the drain and source of the memory cell M1.

When the output v1 from the inverter 2 goes low, switching means TM1 turns on and supplies voltage Vd (6 V to 7 V) to the drain electrode of the memory cell M1, raising the drain electrode voltage M1-D. At the same time, switching means TM2 turns off, disconnecting the source electrode of the memory cell M1 from ground (0 V), thus allowing the source electrode voltage M1-S to rise.

When switching means TM1 turns on, the drain voltage M1-D of the memory cell M1 rises to Vd substantially immediately. The source voltage M1-S rises with a slight lag because of the time taken for charge to cross the memory cell from the drain side to the source side.

Next, when the output v1 from the inverter 2 goes high, switching means TM1 turns off, disconnecting the drain electrode of the memory cell M1 from the power supply voltage Vd, thus allowing the drain voltage M1-D to decrease. At the same time, switching means TM2 turns on, connecting the source electrode of the memory cell M1 to ground (0 V) and lowering the source voltage M1-S.

When switching means TM2 turns on, the source voltage M1-S falls to the ground voltage (0 V) substantially immediately. The drain voltage M1-D falls with a slight lag because of the time taken for charge to cross the memory cell from the drain side to the source side.

As shown in FIG. 2, P-MOS transistor TM1 and N-MOS transistor TM2 are never on simultaneously, so there is no high current flow of the type that occurs during conventional CHE injection. The only current that flows is due to transient voltage changes that occur when the transistors switch on and off, charging and discharging the parasitic capacitance of the drain electrode and source electrode of the memory cell M1. As transistors TM1 and TM2 have mutually complementary on/off switching characteristics, similar current spikes are generated by the charging and discharging of the parasitic source and drain capacitances at the rising edge and falling edge of the input pulse signal v1.

The time lag in the fall of the drain voltage M1-D of the memory cell is drawn in FIG. 2 with an intentionally exaggerated scale for illustrative purposes, to show how the current spikes $I_{DS}$ are generated in this embodiment. A time lag as large as shown in FIG. 2 would rarely occur in practice.

The time lag in the rise of the source voltage M1-S of the memory cell is also drawn in FIG. 2 with an intentionally exaggerated scale for illustrative purposes. A time lag as large as shown in FIG. 2 would rarely occur in practice.

The current $I_{DS}$ flowing between the drain and the source of the memory cell M1 shown in FIG. 2 is generated by the charging or discharging of the parasitic capacitance of the source or drain electrode of the memory cell M1. As the current is generated at the switching timing of the switching means, it is a spike current with an impulse-like waveform.

Since the pulse signal v1 generated from the clock signal WRCLK by the inverter 2 to write data in the memory cell M1 comprises a plurality of pulses occurring at regular intervals, the switching means TM1 and TM2 switch on and off at regular intervals, sending a plurality of current spikes through the memory cell of M1, alternately charging and discharging its parasitic capacitance. Electrons are injected into the floating gate FG2 of the memory cell M1 during the current spikes, thereby writing data into the nonvolatile semiconductor memory device.

This embodiment has a configuration that sends current spikes through the memory cell M1 when either a rising edge or a falling edge of the pulse signal v1 is input to the switching means TM1 and the TM2. Therefore, two current spikes are generated per pulse, one at the rising edge and one at the falling edge of the pulse. Since the pulse signal v1 is an inverted clock signal (WRCLK, supplied to write data into the memory cell M1), pulses are received at regular intervals.

Figure 3:
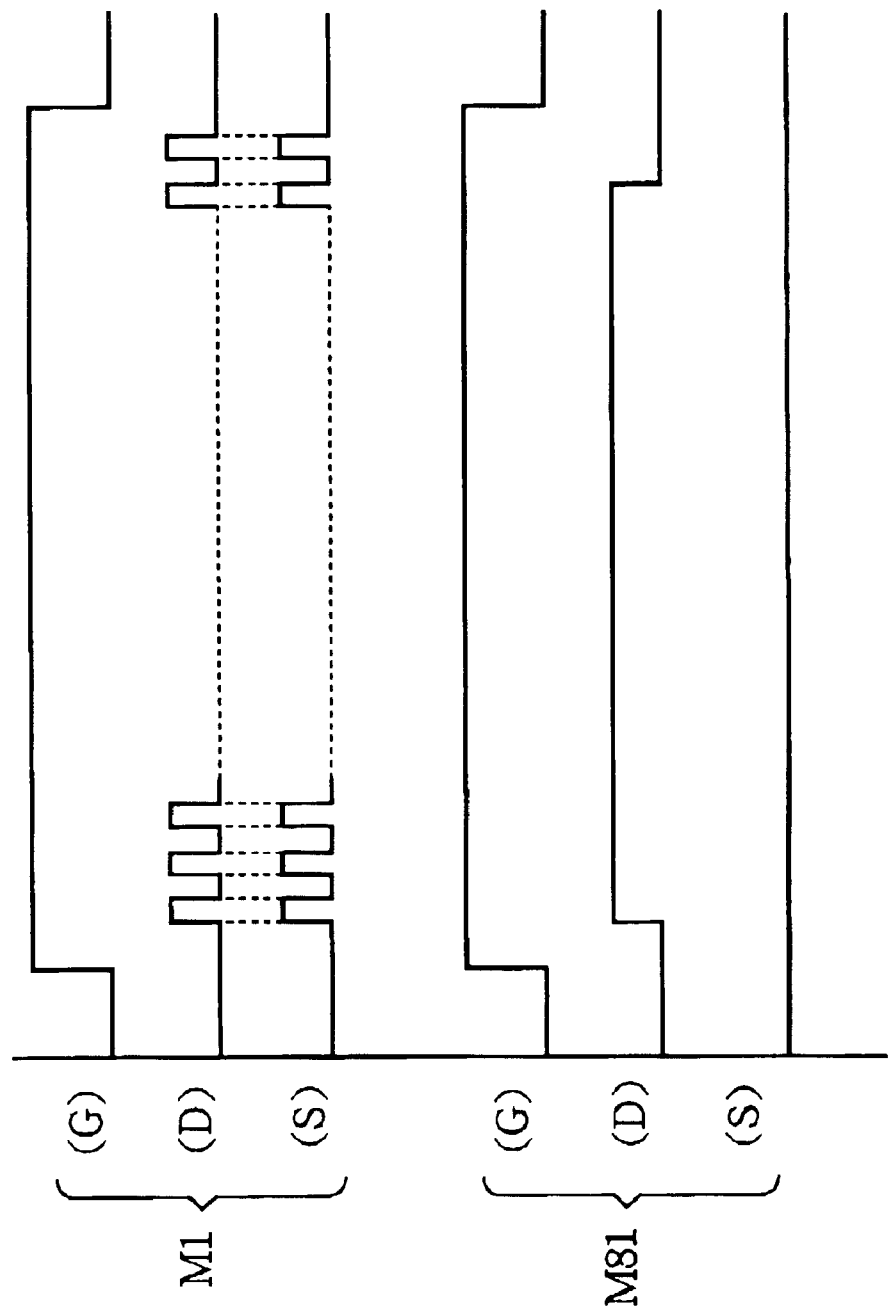
FIG. 3 is a timing diagram showing memory cell voltages when electrons are injected by the invented method and by conventional CHE injection.

Next, conventional CHE injection will be compared with the method of electron injection in the present embodiment, and the differences will be explained in more detail. FIG. 3 is a timing diagram that illustrates voltage waveforms during conventional CHE injection in memory cell M81, and electron injection in memory cell M1 by the method of this embodiment.

When electrons are injected into the floating gate of memory cell M1 according to this embodiment, first a 12-V power supply voltage Vg is applied to the control gate (G) of the memory cell M1.

The voltage at the drain (D) of memory cell M1 is switched in response to the state of the pulse signal v1 obtained by inverting the write clock signal WRCLK. For example, when pulse signal v1 is high, switching means TM1 is off and switching means TM2 is on, so the drain voltage is the ground voltage (0 V). When pulse signal v1 is low, switching means TM1 is on and switching means TM2 is off, so the drain voltage is the drain power supply voltage Vd (6 V to 7 V). The voltage drop in the memory cell M1 and switching means TM1, TM2 is ignored here.

The voltage at the source (S) of the memory cell M1 is basically the same as the voltage at the drain (D), because the source (S) and the drain (D) of the memory cell M1 are disposed between the switching means TM1 and TM2.

As the two switching means do not turn on simultaneously, no high current flows through the memory cell M1, but due to the parasitic capacitance of the source and drain electrodes, current spikes flow from the drain side to the source side, at the rising and falling edges of the pulse signal. Transient switching current that may flow when the switching means are both partly on is ignored here.

When electrons are injected into the conventional memory cell M81, its control gate (G) receives the gate power supply voltage Vg (12 V), as in the present embodiment. However, the drain (D) voltage of the conventional memory cell M81 remains at the same level (6 V to 7 V) during the entire period of the single write control pulse, because the drain electrode is continuously connected to the drain power supply Vd. Similarly, the source (S) voltage of the conventional memory cell M81 remains at basically 0 V because the source electrode is connected continuously to ground.

Therefore, high current flows in the conventional memory cell M81 during a period equal to the pulse width of the single write control pulse. This high current generates high-energy (hot) electrons, some of which are injected into the floating gate FG82 of the memory cell M81.

It has recently become known that when electrons are injected into the floating gate of a memory cell M81 of the conventional CHE injection type by passing a high current through the channel of the memory cell, only a little of the high current contributes to electron injection. Most of the current flowing through the conventional memory cell M81 serves no useful purpose. Although this waste of current can be avoided by FN tunneling, FN tunneling takes extra time. Therefore, when long write times must be avoided, there is no alternative to CHE injection.

The present inventor conjectured that it might be possible to inject electrons into the floating gate of the memory cell by providing a switching means on at least the drain side of the memory cell, and generating current spikes by charging and discharging the parasitic capacitance of the drain electrode of the memory cell, or the parasitic capacitance of the source electrode of the memory cell, using a pulse signal that rose and fell at regular intervals. The inventor conducted experiments to test this conjecture.

Figure 4:
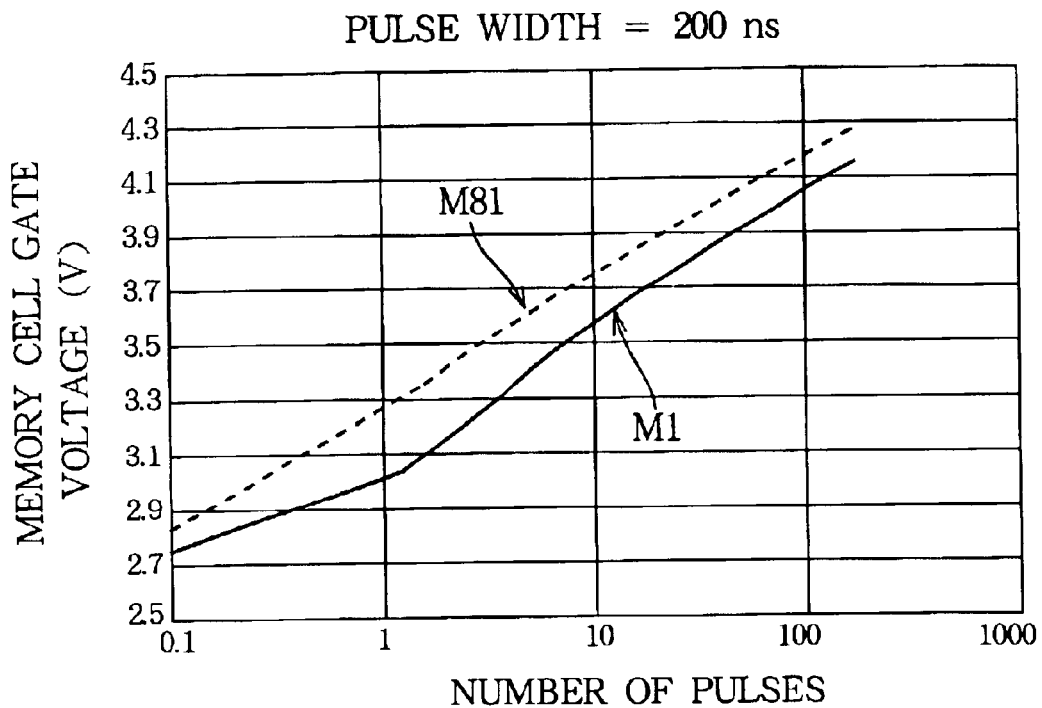
FIG. 4 is a graph comparing conventional CHE injection with the invented method when the pulses in the invented method have a pulse width of two hundred nanoseconds.

Next, the results of the experiments conducted by the inventor will be described. FIG. 4 shows voltage variations observed when pulses with a pulse width of two hundred nanoseconds (200 ns) were applied to the gate of the memory cell of this embodiment at regular intervals.

In FIG. 4, the number of pulses is plotted on the horizontal axis, and the gate voltage resulting in a current of one microampere (1 $\mu A$) between the drain and source electrodes of the memory cell is plotted on the vertical axis. This gate voltage is the threshold voltage, which rises according to the amount of charge injected into the floating gate. The solid line marked M1 indicates how this gate voltage rose with the number of pulses when a pulse signal (clock signal) with a 200-ns pulse width was supplied to the switching means TM1 and TM2 in FIG. 1. For comparison, the dotted line marked M81 indicates the corresponding change in the gate voltage of a memory cell programmed by conventional CHE injection type.

As can be seen in FIG. 4, when pulses are applied at regular intervals with a pulse width of 200 ns in the present embodiment, the gate voltage (threshold value) rises at a rate comparable to that seen in conventional CHE injection with high current. This indicates almost the same level of charge injection into the floating gate as in the conventional CHE method. Therefore, it can be concluded that even with the relatively low current consumed by charging and discharging the parasitic capacitance of the memory cell, there is a high electric field between the source and drain, generating hot electrons around the drain region, and making it possible to inject electrons into the floating gate FG2 of the memory cell M1 of this embodiment.

Figure 5:
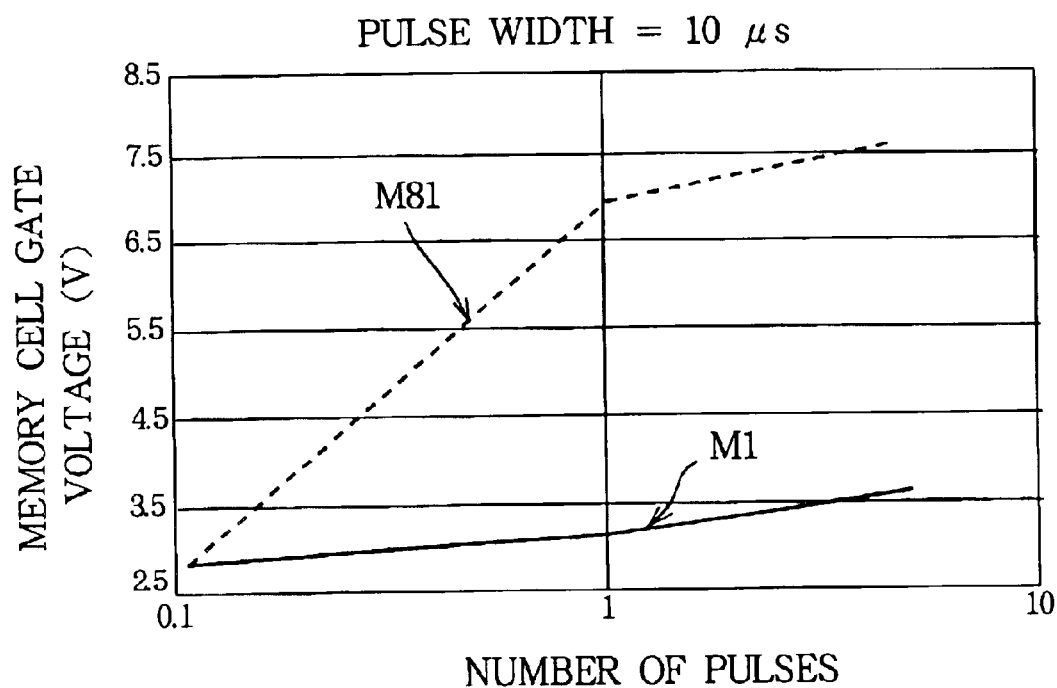
FIG. 5 is a graph comparing conventional CHE injection with the invented method when the pulses in the invented method have a pulse width of ten microseconds.

FIG. 5 illustrates voltage changes when pulses with a pulse width of ten microseconds (10 $\mu s$) were applied to the gate of the memory cell M1 of this embodiment at regular intervals. In this case, a change in the gate voltage (threshold value) comparable to that in conventional CHE injection could not be obtained. In fact, the gate voltage (threshold value) hardly rose at all. This indicates that charge was not being injected into the floating gate at the same level as in the conventional CHE method. Practically speaking, almost no electrons were injected into the floating gate.

FIGS. 4 and 5 reveal that in this embodiment, electrons are injected into the floating gate according to the number of pulses supplied, regardless of the pulse width. However, it should be noted that the pulse width cannot be shorter than the conduction period of one current spike, because enough time must be allowed for the current spike to flow from the drain to the source of the memory cell.

As described above, this embodiment can inject electrons into the floating gate of a memory cell by providing a complementary pair of semiconductor switching means with opposite on/off characteristics (e.g., p-channel semiconductor switching means and n-channel semiconductor switching means), which operate complementarily on the drain side and the source side of the memory cell, and by switching the switching means with short pulse signals at regular intervals, with pulse widths of 200 ns, for example, to pass a plurality of current spikes through the memory cell. Thus, the device according to this embodiment can inject electrons into the floating gate of the memory cell in a comparatively short period of time with a concise control circuit, without requiring a high current.

Second Embodiment

The first embodiment described above injects electrons into the floating gate of a single memory cell. The second embodiment, which will be described next, injects electrons into the floating gates of designated memory cells in an array of memory cells arranged in a row-column matrix.

Figure 6:
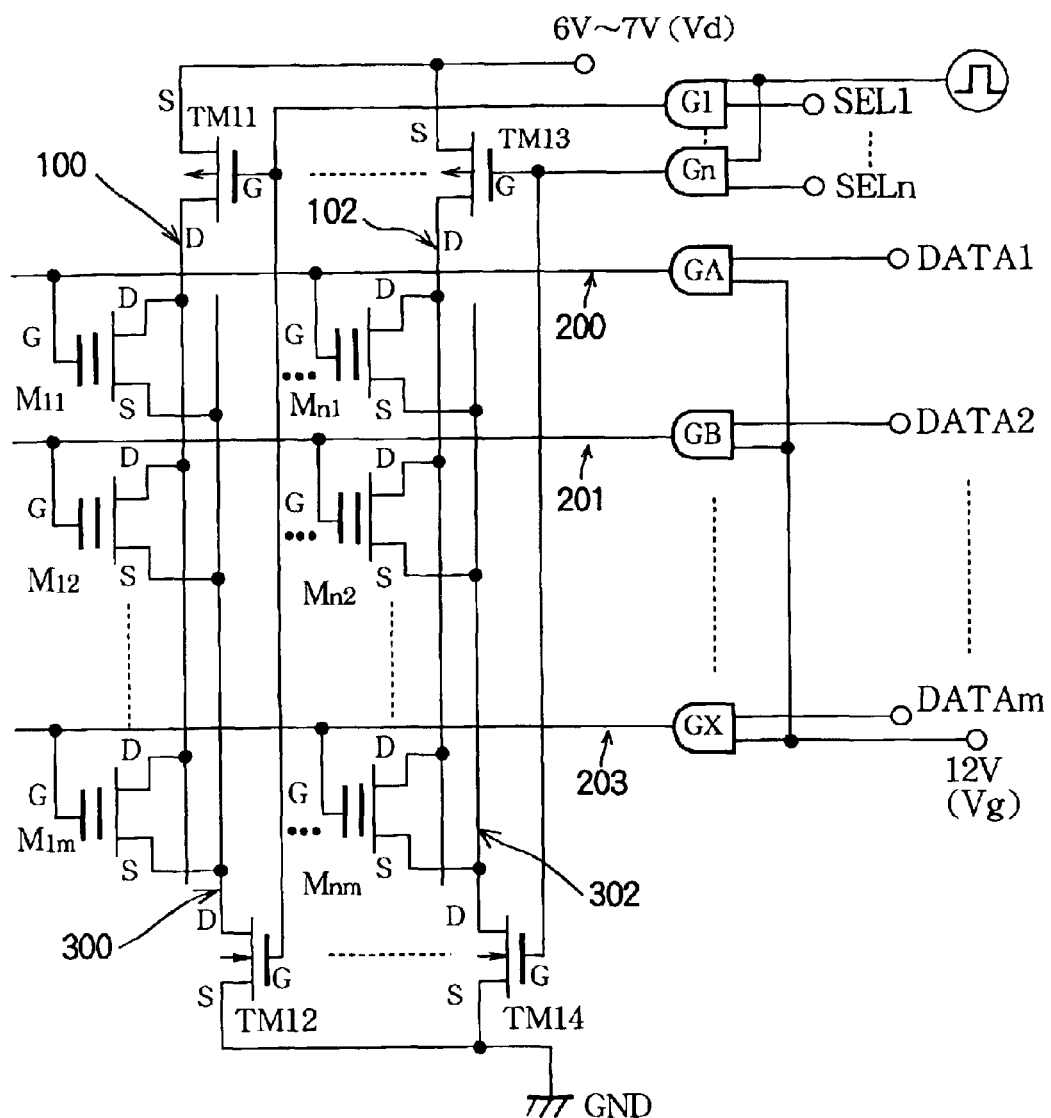
FIG. 6 is a circuit diagram illustrating part of a nonvolatile semiconductor memory device according to a second embodiment of the invention.

FIG. 6 is a block diagram showing the structure of a nonvolatile semiconductor memory device according to the second embodiment of the invention. Each memory cell from $M_{11}$ to $M_{nm}$ has a floating gate similar to the floating gate FG2 in the memory cell M1 of the first embodiment.

The memory cells $M_{11}$ to $M_{1m}$ in the leftmost vertical column in FIG. 6 have their drain electrodes connected to a first common bit line 100. Similarly, the memory cells $M_{n1}$ to $M_{nm}$ in the nth vertical column from the left have their drain electrodes connected to an nth common bit line 102. Memory cells $M_{11}$ to $M_{1m}$ have their source electrodes connected to a first common source line 300, and memory cells $M_{n1}$ to $M_{nm}$ have their source electrodes connected to an nth common source line 303.

The memory cells $M_{11}$ to $M_{n1}$ in the top horizontal row of the memory cell array in FIG. 6 have their control gate electrodes connected to a first common word line 200, the memory cells $M_{12}$ to $M_{n2}$ in the second row have their control gate electrodes connected to a second common word line 201, and the memory cells $M_{1m}$ to $M_{nm}$ in the bottom row have their control gate electrodes connected to an mth common word line 203.

The power supply end of the first common bit line 100 has a P-MOS transistor TM11 connected as a switching means similar to the P-MOS switching means TM1 in the first embodiment. Transistor TM11 has its drain electrode connected to one end of the first common bit line 100, its source electrode connected to the drain power supply Vd (6 V to 7 V), and its gate electrode connected to the output terminal of an AND gate G1, which will be described later.

The ground end of the first common bit line 100 has an N-MOS transistor TM12 connected as a switching means similar to the N-MOS switching means TM2 of the first embodiment. Transistor TM12 has its drain electrode connected to the first common bit line 100, its source electrode connected to ground (0 V), and its gate electrode connected, together with the gate electrode of transistor TM11, to the output terminal of the AND gate G1.

Similarly, the nth common bit line 102 is switchably connected to the drain power supply Vd (6 V to 7 V) through a P-MOS transistor TM13, and is switchably connected to ground (0 V) through an N-MOS transistor TM12. Transistor TM13 has its drain electrode connected to one end of the nth common bit line 102, its source electrode connected to the power supply Vd (6 V to 7 V), and its gate electrode connected to the output terminal of an AND gate Gn (described later). Transistor TM14 has its drain terminal connected to the other end of the nth common bit line 102, its source electrode connected to ground (0 V), and its gate electrode connected, together with the gate electrode of transistor TM13, to the output terminal of AND gate Gn.

AND gate G1 takes the logical AND of a pulse signal (a clock signal or an inverted clock signal), which is supplied to all of the switching means in this embodiment, and a selection signal SEL1 that selects the memory cells connected to the first common bit line 100. Similarly, AND gate Gn takes the logical AND of the pulse signal and a selection signal SELn that selects the memory cells connected to the nth common bit line 102.

Although not shown in FIG. 6, the memory cell array in this embodiment has a plurality of common bit lines between the first common bit line 100 and the nth common bit line 102. These common bit lines are provided with switching means at both ends (a P-MOS transistor at one end and an N-MOS transistor at the other end), and a pulse signal is output from an AND gate to the gate electrodes of both switching means.

One end of the first common word line 200 is connected to the output terminal of an AND gate GA, one end of the second common word line 201 is connected to the output terminal of an AND gate GB, and one end of the mth common word line 203 is connected to the output terminal of an AND gate GX.

AND gate GA takes the logical AND of a 12-V power supply voltage Vg supplied to the control gates of the memory cells in this embodiment, and a data signal DATA1 that supplies data to the memory cells connected to the first common word line 200.

Similarly, AND gate GB takes the logical AND of the 12-V power supply voltage Vg and a data signal DATA2 that supplies data to the memory cells connected to the second common word line 201. AND gate GX takes the logical AND of the 12-V power supply voltage Vg and a data signal DATAm that supplies data to the memory cells connected to the mth common word line 203.

Figure 7:
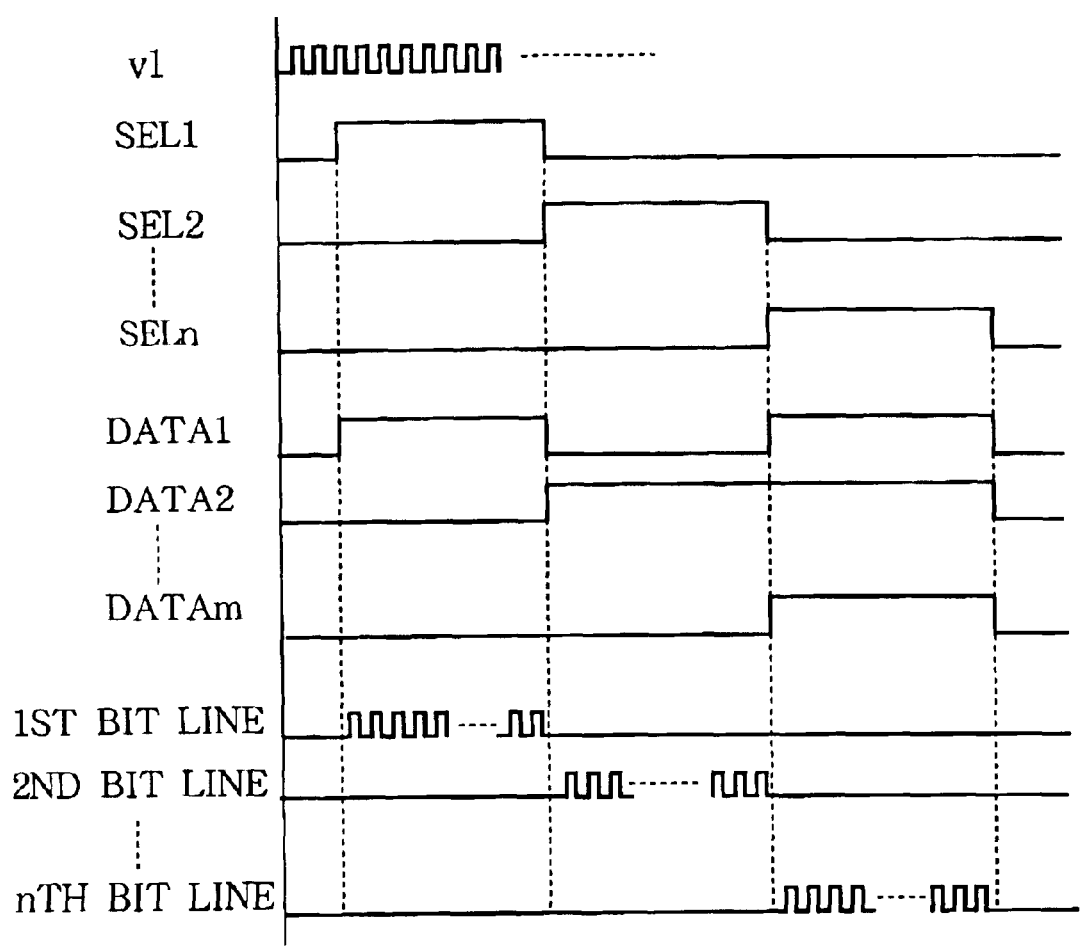
FIG. 7 is a timing diagram showing signal waveforms in the circuit in FIG. 6.

Next, the operation of the nonvolatile semiconductor memory device in this embodiment will be described. FIG. 7 is a timing diagram that shows signals at various points in the nonvolatile semiconductor device in FIG. 6.

Shown at the top is waveform of the pulse signal, which is received from a pulse generation circuit at regular intervals for the purpose of writing data into the memory cells in this embodiment. The pulse generation circuit may be a circuit similar to the inverter 2 in the first embodiment that receives a clock signal WRCLK, inverts it, and outputs an inverted signal v1.

Shown next are the waveform of the selection signal SEL1 input to the first AND gate G1, the waveform of the selection signal SEL2 input to the second AND gate G2 (not shown in FIG. 6), the waveform of the selection signal SELn input to the nth AND gate Gn, the waveform of the data signal DATA1 input to AND gate GA, the waveform of the data signal DATA2 input to AND gate GB, the waveform of the data signal DATAm input to AND gate GX, the waveform of the voltage pulses supplied from switching means TM11 to the drain electrodes of the memory cells $M_{11}$ to $M_{1m}$ connected to the first common bit line 100, the waveform of the voltage pulses supplied from the switching means in the second column from the left (not shown in FIG. 6) to the drain electrodes of the memory cells connected to the second common bit line, and the waveform of the voltage pulses supplied from switching means TM13 to the drain electrodes of the memory cells $M_{n1}$ to $M_{nm}$ connected to the nth common bit line 102. The three bit-line waveforms in FIG. 7 correspond to the M1-D waveform in FIG. 2 of the first embodiment.

When electrons are to be injected into the floating gates of memory cells connected to the first common bit line 100, the selection signal SEL1 shown in FIG. 7 goes high, and pulse signals received from the pulse generation circuit at regular intervals are output from AND gate GI to the first common bit line 100. These pulse signals are supplied to the drain electrodes of all the memory cells $M_{11}$ to $M_{1m}$ connected to the first common bit line 100.

If the data signal DATA1 input to AND gate GA is high at this time, as shown in FIG. 7, the 12-V power supply voltage Vg is output on the first common word line 200 and supplied to the control gate of memory cell $M_{11}$. Electrons are then injected into the floating gate of memory cell $M_{11}$ as described in the first embodiment.

If data signal DATA1 is low at this time (not as shown in FIG. 7), the 12-V power supply voltage Vg is not output on the first common word line 200 or supplied to the control gate of memory cell $M_{11}$. Electrons then are not injected into the floating gate of memory cell $M_{11}$, due to lack of an intense electric field.

Other vertical columns in the memory cell array are selected in a similar manner. When electrons are to be injected into the floating gates of memory cells connected to the second common bit line (not shown), the selection signal SEL2 shown in FIG. 7 goes high, and the pulse signals received from the pulse generation circuit at regular intervals are output from the corresponding AND gate to the second common bit line. These pulse signals are supplied to the drain electrodes of all the memory cells connected to the second common bit line.

When electrons are to be injected into the floating gates of the memory cells $M_{n1}$ to $M_{nm}$ connected to the nth common bit line 102, the selection signal SELn shown in FIG. 7 goes high, and the pulse signals received from the pulse generation circuit at regular intervals are output from AND gate Gn to the nth common bit line 102 and supplied to the drain electrodes of all the memory cells $M_{n1}$ to $M_{nm}$ connected to the nth common bit line 102.

The second to mth horizontal rows in the memory cell array are selected in the same manner as the first horizontal row. When a high level data signal DATA2 is input to AND gate GB, the 12-V power supply voltage Vg is output on the second common word line 201 and supplied to the control gates of all the memory cells connected to the second common word line 201. When a high level data signal DATAm is input to AND gate GX, the 12-V power supply voltage Vg is output on the mth common word line 203 and supplied to the control gates of all the memory cells connected to the mth common word line 203.

Conversely, when a low data signal DATA2 is input to AND gate GB, the 12-V power supply voltage Vg is not output on the second common word line 201 and is not supplied to the control gates of the memory cells $M_{12}$ to $M_{n2}$ connected thereto. Therefore, electrons are not injected into the floating gates of memory cells $M_{12}$ to $M_{n2}$, due to lack of an intense electric field.

Similarly, when a low data signal DATAm is input to AND gate GX, the 12-V power supply voltage Vg is not output on the mth common word line 203 or supplied to the control gates of the memory cells $M_{1m}$ to $M_{nm}$ connected to the mth common word line 203. Therefore, electrons are not injected into the floating gates of memory cells $M_{1m}$ to $M_{nm}$, due to lack of an intense electric field.

The waveform of the first bit line shows the voltage pulses supplied to the drain electrodes of the memory cells $M_{11}$ to $M_{1m}$ connected to the first common bit line 100 when selection SEL1 is high. If data signal DATA1 is also high, as shown in FIG. 7, the 12-V power supply voltage Vg is supplied to the first common word line 200, and electrons are injected into the floating gate of memory cell $M_{11}$.

Similarly, the waveform of the second bit line shows the voltage pulses supplied to the drain electrodes of the memory cells connected to the second common bit line, in the second column from the left, when selection signal SEL2 is high. If data signal DATA2 is high, as shown in FIG. 7, the 12-V power supply voltage Vg (12 V) is supplied to the second common word line 201 and electrons are injected into the floating gate of the memory cell $M_{22}$ (not shown in FIG. 6) at the intersection of the second column from the left and the second row from the top.

The waveform of the nth bit line shows the voltage pulses supplied to the drain electrodes of the memory cells $M_{n1}$ to $M_{nm}$ connected to the nth common bit line 102, in the rightmost column, when selection signal SELn is high. If data signals DATA1, DATA2, and DATAm are high, as shown in FIG. 7, the 12-V power supply voltage Vg is supplied to the corresponding common word lines, and electrons are injected into the floating gates of memory cells $M_{n1}$, $M_{n2}$, and $M_{nm}$.

This embodiment enables a memory cell at any position in the memory cell array to be selected for the injection of electrons, that is, for the writing of data. Electrons are injected into each memory cell in the same way as in the first embodiment.

In a memory device employing conventional CHE injection for programming, if the power supply cannot provide sufficient current to write data into a plurality of memory cells simultaneously, the data have to be written into the memory cells one by one. If the write access time per memory cell is ten microseconds (10 $\mu$s), for example, in a memory cell array using conventional CHE injection, writing one megabit (1 Mbit) of data bit by bit takes 10.48576 seconds (10 $\mu$s×1048576 bits). The second embodiment, which does not require high current, can write data into all memory cells connected to one bit line simultaneously. If 1024 memory cells are connected to each bit line, then even if it takes it takes ten times as long (100 $\mu$s) to program one memory cell in this embodiment as it takes to program one memory cell by conventional CHE injection, it still takes only 0.1024 second to write 1 Mbit of data (100 $\mu$s×1048576 bits/1024 bits=100 $\mu$s×1024 bit lines).

Since this embodiment can inject electrons into a selected plurality of memory cells connected to, for example, a common bit line in a memory cell array, without having to pass high current between the sources and drains of the memory cells, when a power supply with a high current capability is not available, the memory cells can be programmed in much less time than would be required for conventional CHE injection.

Third Embodiment

When a memory cell is programmed in the first and second embodiments, both its source and drain electrodes are switched, as described above. When a memory cell is programmed in the third embodiment, described below, its source electrode is left floating, and only its drain electrode is switched. An effect similar to that of the first embodiment is achieved.

Figure 8:
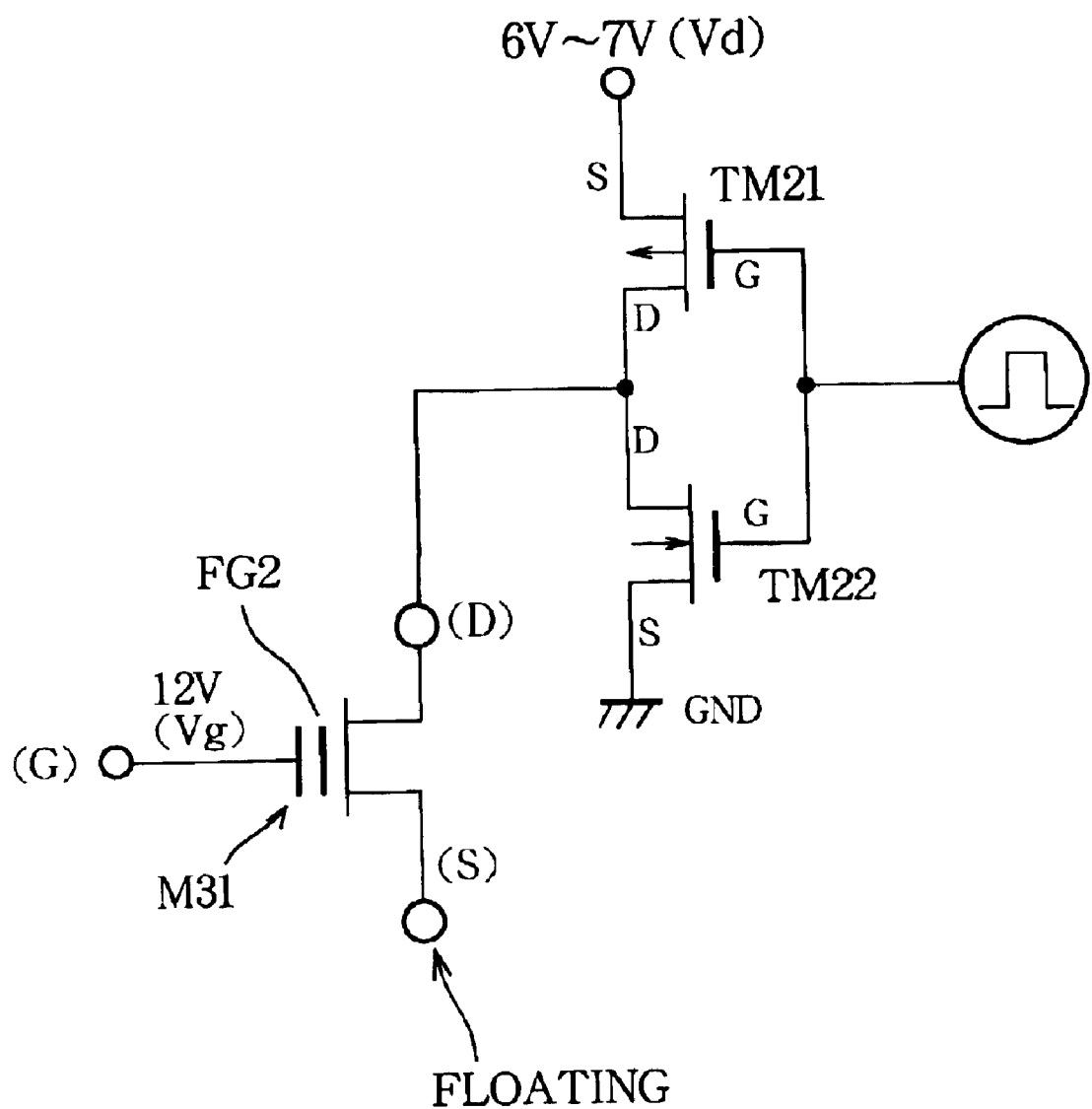
FIG. 8 is a circuit diagram illustrating part of a nonvolatile semiconductor memory device according to a third embodiment of the invention.

FIG. 8 is a block diagram showing the structure of a nonvolatile semiconductor memory device according to the third embodiment of the invention. As in the first embodiment, this nonvolatile semiconductor memory device has two switching means that supply current spikes to the memory cell at the rising and falling edges of a pulse signal generated at regular intervals, but both switching means are now connected to the drain electrode (D) of the memory cell M31. During programming, the source electrode (S) of memory cell M31 is left floating. The memory cell M31 itself has the same structure as in the first embodiment, with a control gate (FG) and a floating gate FG2.

In the third embodiment, a P-MOS transistor TM21 and an N-MOS transistor TM22 are connected in series between a drain power supply and ground, and both of these transistors are also connected to the drain side of the memory cell M31. A pulse signal v1 is supplied to the gate electrodes G of both transistors TM21 and the TM22. The pulse signal v1 may be generated from a clock signal WRCLK by an inverter 2 as described in the first embodiment.

Transistor TM21 has its source electrode S connected to the drain power supply Vd (6 V to 7 V), and its drain electrode D connected to the drain electrodes of both transistor TM22 and the memory cell M31. Transistor TM22 has its source electrode S connected to ground (0 V), and its drain electrode D connected to the drain electrodes of transistor TM21 and the memory cell M31.

As in the first embodiment, the two switching means TM21 and TM22 have complementary on/off switching characteristics and are never switched on simultaneously, so no steady-state current flows from the drain power supply Vd to ground. The voltage supplied to the drain electrode of the memory cell M31 varies as in the first embodiment. The drain voltage of memory cell M31 has a pulse waveform that alternates between high and low levels in response to the input pulse signal, substantially as the M1-D waveform does in FIG. 2. The third embodiment will therefore be described with reference to FIG. 2; TM1, TM2, and M1 should now be read as TM21, TM22, and M31, respectively.

In this embodiment, since no switching means is provided on the source side of the memory cell M31, during programming, the source electrode of the memory cell M31, which is left floating, follows the voltage of the drain electrode. Therefore, the source electrode voltage of the memory cell M31 has substantially the same waveform as the M1-S waveform as shown in FIG. 2 in the first embodiment. In the third embodiment, however, the pulse waveforms have sharp rising and falling edges at the drain electrode, and do not have sharp rising or falling edges at the source electrode. The current spikes shown in the bottom ($I_{DS}$) waveform in FIG. 2 therefore flow in alternate directions between the source and drain electrodes of memory cell M31, although the timing is the same as in FIG. 2.

The operation of the third embodiment will be described with reference to FIG. 2. When the input pulse signal v1 goes low (0 V), transistor TM21 turns on, and the drain power supply voltage Vd (6 V to 7 V) is supplied to the drain electrode of the memory cell M31. Meanwhile, transistor TM22 turns off, allowing the drain voltage to rise. As a result, the source voltage of memory cell M31 also rises to the Vd level (6 V to 7 V).

The drain electrode of memory cell M31 rises to the Vd level substantially immediately, as shown by waveform M1-D in FIG. 2. The source voltage of memory cell M31 rises with a slight lag because of the time taken for current to cross the memory cell from the drain side to the source side and charge the parasitic capacitance on the source side. This lag produces a current spike.

Next, when the input pulse signal v1 goes high as shown in FIG. 2, transistor TM21 turns off, disconnecting the drain electrode of the memory cell M31 from the drain power supply. Meanwhile, transistor TM22 turns on, connecting the drain electrode to ground and lowering its voltage (to 0 V). As a result, the voltage of the floating source electrode also falls to the ground level (0 V).

The voltage of the drain electrode of memory cell M31 falls to the ground level substantially immediately. The voltage of the source electrode of memory cell M31 falls with a slight lag because of the time taken for the current to cross the memory cell from the source side to the drain side, discharging the parasitic capacitance on the source side. Once again, the lag produces a current spike in the memory cell M31.

P-MOS transistor TM21 and N-MOS transistor TM22 (TM1 and TM2 in FIG. 2) are always in mutually opposite on/off states, even though the same signal v1 is input to the gate electrodes of both transistors. Since P-MOS transistor TM21 and N-MOS transistor TM22 are never switched on simultaneously, there is no high current flow between the drain power supply Vd and ground. The current flow is limited to the series of current spikes that alternately charge and discharge the parasitic capacitance of the source (and drain) electrode of the memory cell M1.

Thus the third embodiment, like the first embodiment, can write data in a memory cell without the high current flow that occurs in a nonvolatile memory during conventional CHE injection. As the switching means have opposite on/off characteristics, similar current spikes are generated by the charging and discharging of the parasitic capacitance of the memory cell and its source and drain signal lines at the rising edge and falling edge of the input pulse signal.

In the third embodiment, there is almost no time lag in the rise and fall of the drain electrode voltage of memory cell M31, while the source electrode voltage both rises and falls with a time lag.

Although the waveform shown at the bottom of FIG. 2 comprises only positive current spikes, the current $I_{DS}$ flowing between the drain and source of the memory cell M31 in the third embodiment includes both positive and negative current spikes, generated by the alternate charging and discharging of the parasitic capacitance of the source electrode of memory cell M31. Other than this difference, the third embodiment operates in essentially the same way as the first embodiment.

The third embodiment has same effect as the first embodiment in that electrons can be injected into the floating gate of a memory cell with a concise control circuit, without either requiring high current or taking an excessive amount of time. The control circuit on the source side of the memory cell is particularly simplified. If the source electrode is left floating during read access, the source-side control circuit can be more completely eliminated.

Fourth Embodiment

The third embodiment described above injects electrons into the floating gate of a single memory cell by controlling its drain potential. The fourth embodiment, which will be described next, employs the method of the third embodiment to inject electrons into the floating gates of designated memory cells in an array of memory cells arranged in a row-column matrix.

Figure 9:
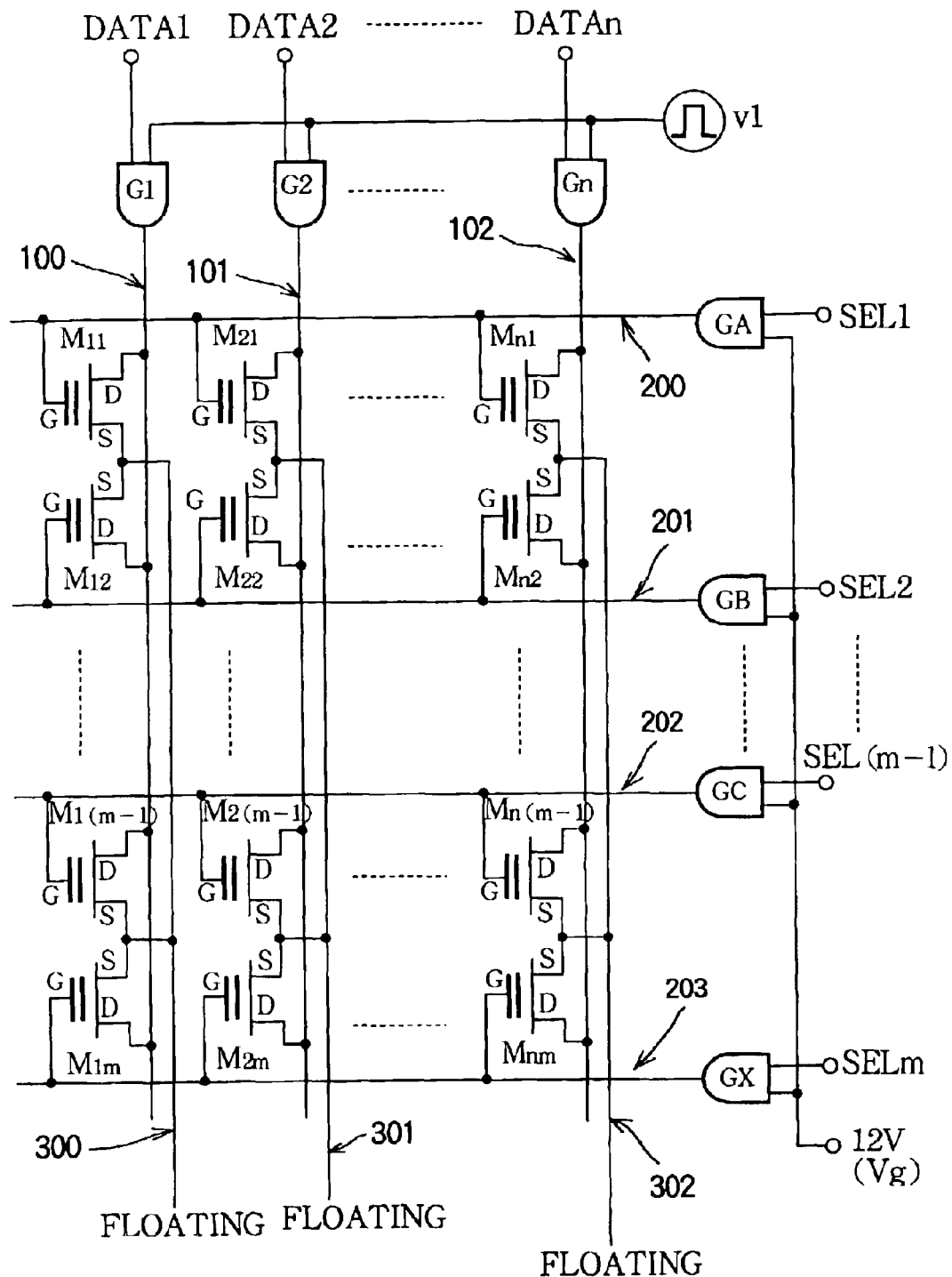
FIG. 9 is a circuit diagram illustrating part of a nonvolatile semiconductor memory device according to a fourth embodiment of the invention.

FIG. 9 is a block diagram illustrating the structure of a nonvolatile semiconductor memory device according to the fourth embodiment of the invention. Each memory cell $M_{11}$ to $M_{nm}$ has a floating gate similar to the floating gate FG2 of the memory cell M31 in the third embodiment.

The memory cells $M_{11}$ to $M_{nm}$ of the memory cell array shown in FIG. 9 are laid out and connected to common bit lines 100, 101, 102, common word lines 200, 201, 202, 203, and common source lines 300, 301, 302 in the same way as in the second embodiment, shown in FIG. 6.

In the fourth embodiment, however, the first common bit line 100 is connected to the output terminal of an AND gate G1. The AND gate G1 takes the logical AND of a pulse signal v1 (a clock signal or an inverted clock signal) received from a pulse generating circuit (not shown), and a data signal DATA1.

As is well known, an AND gate is a NAND gate with an output inverter circuit. The switching means TM21 and TM22 in the third embodiment also constitute an inverter circuit. Thus AND gate G1 includes an inverter circuit comprising switching means as described in the third embodiment. This inverter circuit receives the drain power supply voltage Vd (6 V to 7 V) and the ground potential as shown in FIG. 8. When data signal DATA1 is high, accordingly, AND gate G1 outputs voltage pulses that alternate between the Vd and ground levels at timings determined by the pulse signal v1. When data signal DATA1 is low, the output of AND gate G1 remains at the ground level.

The other common bit lines, from the second common bit line 101 to the nth common bit line 102, are connected to similar AND gates G2 to Gn that take the logical AND of the pulse signal v1 and data signals DATA2 to DATAn.

During the writing of data, the end of the first common bit line 100 not connected to AND gate G1 is electrically floated by a control circuit not shown in the drawing. Similarly, the second common bit line 101 has one end connected to an AND gate G2, the nth common bit line 102 has one end connected to an AND gate Gn, and the other ends of these common bit lines 101, 102 are left floating during the writing of data.

The first common word line 200 has one end connected to the output terminal of an AND gate GA, the second common word line 201 has one end connected to the output terminal of an AND gate GB, the (m-1)th common word line 202 has one end connected to the output terminal of an AND gate GC, and the mth common word line 203 has one end connected to the output terminal of an AND gate GX.

AND gate GA takes the logical AND of a 12-V power supply voltage Vg supplied to the control gates of the memory cells of this embodiment, and a selection signal SEL1 that selects the memory cells connected to the first common word line 200.

Similarly, AND gate GB takes the logical AND of the 12-V power supply voltage Vg and a selection signal SEL2 that selects the memory cells connected to the second common word line 201. AND gate GC takes the logical AND of the 12-V power supply voltage Vg and a selection signal SEL (m-1) that selects the memory cells connected to the (m-1)th common word line 202. AND gate GX takes the logical AND of the 12-V power supply voltage Vg and a selection signal SELm that selects the memory cells connected to the mth common word line 203.

Figure 10:
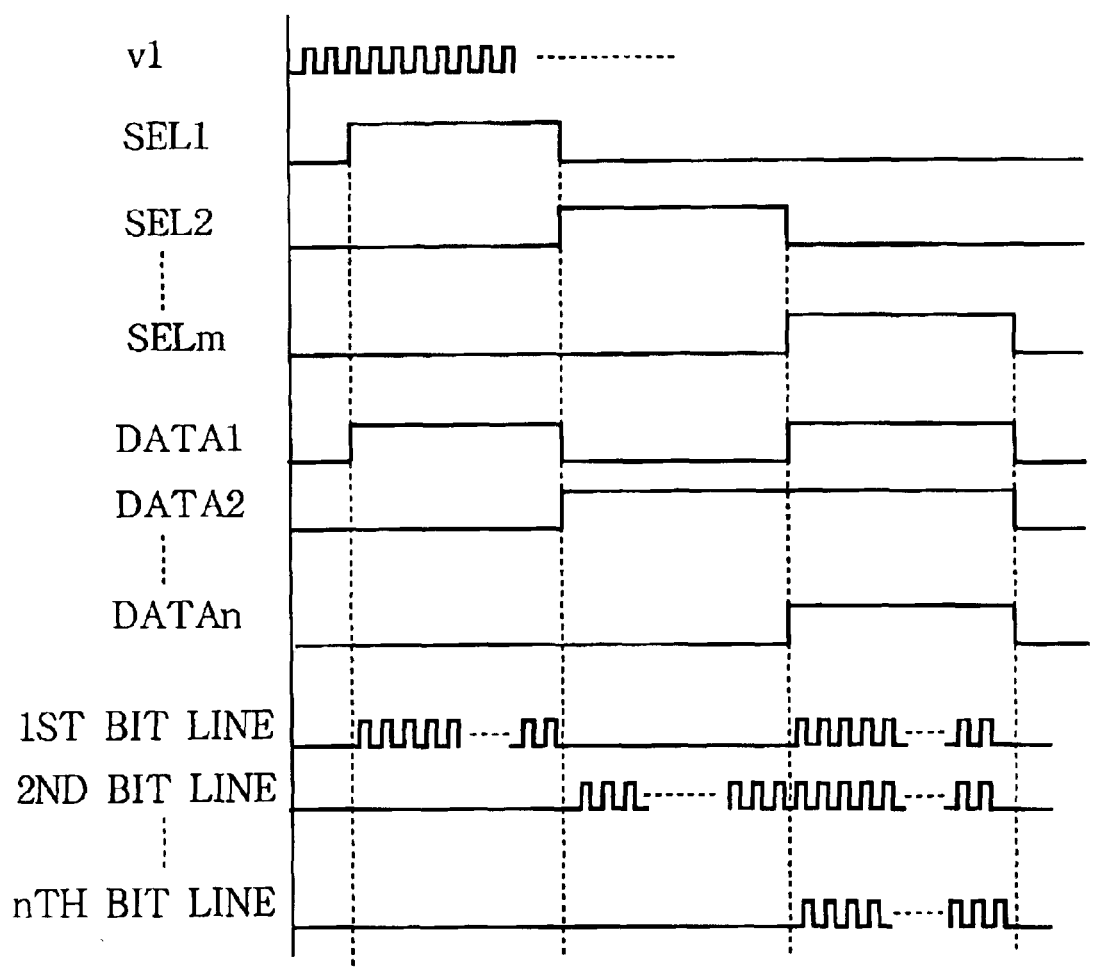
FIG. 10 is a timing diagram showing signal waveforms in the circuit in FIG. 9.

Next, the operation of the fourth embodiment will be described. FIG. 10 is a timing diagram showing signals at various points in the nonvolatile semiconductor memory device in FIG. 9.

The signals shown in FIG. 10 are similar to those shown in FIG. 7 in the second embodiment, except that different signals are used for selecting vertical columns and horizontal rows in the memory cell array. The data signals DATA1 to DATAn now select the vertical columns, and the selection signals SEL1 to SELm select the horizontal rows.

Shown in order from top to bottom are the waveforms of the pulse signal v1, the selection signal SEL1 input to AND gate GA, the selection signal SEL2 input to AND gate GB, the selection signal SELm input to AND gate GX, the data signal DATA1 input to AND gate G1, the data signal DATA2 input to AND gate G2, the data signal DATAn input to AND gate Gn, the voltage pulses supplied from AND gate G1 to the drain electrodes of memory cells $M_{11}$ to $M_{1m}$ via the first common bit line 100, the voltage pulses supplied to the drain electrodes of memory cells $M_{21}$ to $M_{2m}$ via the second common bit line 101, and the voltage pulses supplied from AND gate Gn to the drain electrodes of memory cells $M_{n1}$ to $M_{nm}$ via the nth common bit line 102.

When electrons are to be injected into the floating gate of a memory cell connected to the first common bit line 100, the data signal DATA1 shown in FIG. 10 goes high. Driven by the pulse signals v1 input from the pulse generation circuit at regular intervals, AND gate G1 generates pulses at the Vd level (6 V to 7 V) on the first common bit line 100. These pulses are supplied to the drain electrodes of all the memory cells $M_{11}$ to $M_{1m}$ connected to the first common bit line 100.

If the selection signal SEL1 input to AND gate GA is high at this time, the 12-V power supply voltage Vg is output on the first common word line 200 and supplied to the control gate of memory cell $M_{11}$. Electrons are then injected into the floating gate of memory cell $M_{11}$ as described in the third embodiment.

Conversely, if selection signal SEL1 is low at this time, the 12-V power supply voltage Vg is not output on the first common word line 200 or supplied to the control gate of memory cell $M_{11}$, and electrons are not injected into the floating gate of memory cell $M_{11}$, due to lack of an intense electric field.

Other vertical columns in the memory cell array of this embodiment are selected in a similar manner. When electrons are to be injected into the floating gate of a memory cell connected to the second common bit line, data signal DATA2 goes high, and the pulse signal v1 input from the pulse generation circuit drives AND gate G2, which generates pulses at the Vd level on the second common bit line 101. These pulses are supplied to the drain electrode of all the memory cells $M_{21}$ to $M_{2m}$ connected to the second common bit line.

When electrons are to be injected into the floating gate of a memory cell connected to the nth common bit line 102, data signal DATAn goes high, and the pulse signal v1 input from the pulse generation circuit drives AND gate Gn, which generates pulses at the Vd level on the nth common bit line 102. These pulse signals are supplied to the drain electrodes of all the memory cells $M_{n1}$ to $M_{nm}$ connected to the nth common bit line 102.

Other horizontal rows in the memory cell array are selected in the same way as the first row. When selection signal SEL2 is high, AND gate GB feeds the 12-V power supply voltage Vg to the second common word line 201, thus to the control gates of memory cells $M_{12}$ to $M_{n2}$. When selection signal SELm is high, AND gate GX feeds the 12-V power supply voltage Vg to the mth common word line 203, thus to the control gates of memory cells $M_{1m}$ to $M_{nm}$.

Conversely, when selection signal SEL2 is low, AND gate GA does not feed the 12-V power supply voltage Vg to the second common word line 201 or its connected memory cells $M_{12}$ to $M_{n2}$. Therefore, electrons are not injected into the floating gates of memory cells $M_{12}$ to $M_{n2}$, due to lack of an intense electric field.

Similarly, when selection signal SELm is low, AND gate GX does not feed the 12-V power supply voltage Vg to the mth common word line 203 or its connected memory cells $M_{1m}$ to $M_{nm}$. Electrons are not injected into the floating gates of memory cells $M_{1m}$ to $M_{nm}$, due to lack of an intense electric field.

The waveform of the first bit line shows the voltage pulses supplied to the drain electrodes of the memory cells $M_{11}$ to $M_{1m}$ connected to the first common bit line 100 when data signal DATA1 is high. Data signal DATA1 is high when selection signal SEL1 is high, at which time the 12-V power supply voltage Vg is supplied to the first common word line 200 and electrons are injected into the floating gate of the memory cell $M_{11}$. Data signal DATA1 is also high when selection signal SELm is high, so electrons are injected into the floating gate of memory cell $M_{1m}$ as well.

Similarly, the waveform of the second bit line shows the voltage pulses supplied to the drain electrodes of the memory cells $M_{21}$ to $M_{2m}$ connected to the second common bit line 101 when data signal DATA2 is high. Data selection signal DATA2 is high when selection signal SEL2 is high, at which time the 12-V power supply voltage Vg is supplied to the second common word line 201 and electrons are injected into the floating gate of memory cell $M_{22}$. Data signal DATA2 is also high when selection signal SELm is high, so electrons are injected into the floating gate of memory cell $M_{2m}$ as well.

The waveform of the nth bit line shows the voltage pulses supplied to the drain electrodes of the memory cells $M_{n1}$ to $M_{nm}$ connected to the nth common bit line 102 when data signal DATAn is high. This occurs when selection signal SELm is high, at which time the 12-V power supply voltage Vg is supplied to the mth common word line 203, and electrons are injected into the floating gate of memory cell $M_{nm}$.

The fourth embodiment enables data to be programmed into a memory cell at any position in the memory cell array, and enables a plurality of memory cells connected to the same common word line to be programmed simultaneously, by injecting electrons into the floating gates of the memory cells as described in the third embodiment.

Since electrons can be injected into a plurality of memory cells designated by respective data signals without having to pass high current between the drain and source electrodes of the memory cells, when a power supply capable of supplying high current to a plurality of memory cells simultaneously is not available, the fourth embodiment provides the same effect as the second embodiment, enabling electrons to be injected into the memory cells much faster than by conventional CHE injection. In addition, the fourth embodiment provides the same effect as the third embodiment in simplifying the control of the source electrodes of the memory cells. In particular, the source lines can be left floating during read access. That is, the data can be read onto the source lines, from memory cells in a selected horizontal row and one or more selected vertical columns, the data signals in FIG. 9 being used to select the columns. Since the source lines are also left floating during programming and erasing, the source line control circuit can be eliminated, and read access can be speeded up by reading a plurality of bits of data simultaneously.

The invention uses a complementary pair of semiconductor switching means, having opposite on/off characteristics, to generate a series of short current spikes by alternately charging and discharging a parasitic capacitance associated with a memory cell. The current spikes are generated by applying pulse signals with a short pulse width (e.g. 200 ns) at regular intervals to the switching means. The current spikes inject electrons into the floating gate of the memory cell without passing high current through the memory cell, and without applying an extremely high voltage to the memory cell. Data can therefore be written in the memory cell without the need for a large power supply or complex control circuitry.

The invented method of writing data is faster than conventional tunneling methods. When the invention is implemented in a memory cell array, it enables electrons to be injected into a plurality of memory cells simultaneously even if the power supply does not have a high current capability. In this case, the invented method of writing data is also faster than conventional CHE injection.

The two complementary switching means may be connected to opposite sides of the memory cell, or both may be connected to the same side, e.g., the drain side. If both switching means are connected to the drain side, the source electrode may be left floating, greatly simplifying the control of the memory cell, especially if the source electrode is also left floating during read access.

The embodiments described above use P-MOS and N-MOS transistors as switching means (in the fourth embodiment, these transistors are integrated into AND gates G1 to Gn). However, it should be noted that the invention is not limited to P-MOS and N-MOS transistor switching means; any circuit, circuit element, or device can be employed as a switching means as long as it can apply voltage pulses to the source or drain of a memory cell without passing a steady flow of current through the memory cell. Similarly, the various AND gates in the second and fourth embodiments can be replaced by other logic gates, circuits, circuit elements, or devices capable of supplying similar signals.

In the second embodiment, selection signals may be used to select the horizontal rows and data signals to select the vertical columns, instead of vice versa. Similarly, in the fourth embodiment, data signals may be used to select the horizontal rows, and selection signals to select the vertical columns. The same effects are obtained.

Those skilled in the art will recognize that further variations are possible within the scope of the invention as defined by the appended claims.

What is claimed is:

1. A nonvolatile semiconductor memory device receiving power at at least a first potential and a second potential, comprising:

a memory cell with a floating gate, a control gate, a first electrode, and a second electrode, the floating gate and control gate controlling current flow between the first electrode and the second electrode; and switching means connected at least to the first electrode of the memory cell, receiving a pulse signal in which rising transitions occur at regular intervals and falling transitions occur at regular intervals, connecting the first electrode of the memory cell to the first potential responsive to the pulse signal to supply current to the memory cell at the rising transitions and/or the falling transitions, thereby injecting electrons into the floating gate, wherein the second electrode is disconnected from the second potential while the first electrode is connected to the first potential responsive to the pulse signal.

2. The nonvolatile semiconductor memory device of claim 1, wherein the switching means comprises a complementary pair of switching elements coupled in series between the first potential and the second potential, and supplies said current to the memory cell at both the rising transitions and the falling transitions of the pulse signal.

3. The nonvolatile semiconductor memory device of claim 2, wherein one switching element of said complementary pair of switching elements is a p-channel metal-oxide-semiconductor transistor, and another switching element of said complementary pair of switching elements is an n-channel metal-oxide-semiconductor transistor.

4. The nonvolatile semiconductor memory device of claim 2, wherein one of said complementary pair of switching elements is connected to the first electrode of the memory cell, and another one of said complementary pair of switching elements is connected to the second electrode of the memory cell.

5. The nonvolatile semiconductor memory device of claim 2, wherein both of said complementary pair of switching elements are connected to the first electrode of the memory cell.

6. A nonvolatile semiconductor memory device, comprising:
a memory cell array having a row-column matrix of memory cells with respective source electrodes, drain electrodes, gate electrodes, and floating gates;
a drain power supply;
a plurality of bit lines interconnecting the drain electrodes of respective columns of memory cells in the memory cell array, for supplying power from the drain power supply to the memory cells;
a source power supply;
a plurality of source lines interconnecting the source electrodes of respective columns of memory cells in the memory cell array, for supplying power from the source power supply to the memory cells;
a gate power supply;
a plurality of word lines interconnecting the gate electrodes of respective rows of memory cells in the memory cell array, for supplying power from the gate power supply to the memory cells; and
a plurality of switching means connected to respective columns of memory cells in the memory cell array through the bit lines and/or the source lines, the switching means also being connected in parallel to the drain power supply and/or the source power supply, receiving a pulse signal in which rising transitions occur at regular intervals and falling transitions occur at regular intervals, and supplying current to the memory cells at the rising transitions and/or the falling transitions, thereby injecting electrons into the floating gate, wherein the switching means is controlled by the pulse signal to block current flow between the source power supply and the drain power supply.

7. The nonvolatile semiconductor memory device of claim 6, wherein the current supplied to the memory cells to inject electrons into the floating gates comprises a series of current spikes due to charging and discharging of a parasitic capacitance.

8. The nonvolatile semiconductor memory device of claim 6, further comprising:
a first plurality of logic gates receiving respective selection signals, for gating the pulse signal according to the selection signals and supplying the gated pulse signal to respective switching means; and
a second plurality of logic gates receiving respective data signals, for gating the gate power supply according to the data signals and supplying the gated gate power supply to respective word lines.

9. The nonvolatile semiconductor memory device of claim 6, further comprising:
a first plurality of logic gates receiving respective data signals, for gating the pulse signal according to the data signals and supplying the gated pulse signal to respective switching means; and
a second plurality of logic gates receiving respective selection signals, for gating the gate power supply according to the selection signals and supplying the gated gate power supply to respective word lines.

10. The nonvolatile semiconductor memory device of claim 6, wherein the pulse signal is a write clock signal.

11. The nonvolatile semiconductor memory device of claim 6, wherein each one of the switching means comprises a complementary pair of switching elements coupled in series, and supplies said current through one of the bit lines at both the rising transitions and the falling transitions of the pulse signal.

12. The nonvolatile semiconductor memory device of claim 11, wherein one switching element of said complementary pair of switching elements is a p-channel metal-oxide-semiconductor transistor, and another switching element of said complementary pair of switching elements is an n-channel metal-oxide-semiconductor transistor.

13. The nonvolatile semiconductor memory device of claim 11, wherein one switching element of said complementary pair of switching elements couples the drain power supply to one of the bit lines, and another switching element of said complementary pair of switching elements couples one of the source lines to the source power supply.

14. The nonvolatile semiconductor memory device of claim 11, wherein one switching element of said complementary pair of switching elements couples the drain power supply to one of the bit lines, and another switching element of said complementary pair of switching elements couples said one of the bit lines to the source power supply.

15. The nonvolatile semiconductor memory device of claim 14, wherein said one switching element and said another switching element form an inverter, and each one of the switching means also comprises a logic gate receiving a data signal, gating the pulse signal according to the data signal, and supplying the gated pulse signal to the inverter.

16. A method of writing data in a nonvolatile semiconductor memory device having a memory cell with a floating gate, and a parasitic capacitance associated with the memory cell, the nonvolatile semiconductor memory device receiving power at a power supply potential and a ground potential, and the nonvolatile semiconductor memory device comprising a switching means connected to the memory cell, the ground potential and the power supply potential, the method comprising:

supplying a pulse signal including a series of pulses to the switching means, thereby generating a series of current spikes by alternately charging and discharging the parasitic capacitance associated with the memory cell while blocking current flow from the power supply potential of the power supply to the ground potential of the power supply; and supplying the current spikes to the memory cell.

17. The method of claim 16, wherein the pulses occur at regular intervals.

18. The method of claim 16, wherein the current spikes are generated at rising edges and/or falling edges of the pulses.

19. The method of claim 16, wherein the current spikes are generated at both rising edges and falling edges of the pulses.

20. The method of claim 16, wherein the pulse signal is a write clock signal.

* * * * *